(12) United States Patent
Chen et al.

(10) Patent No.: US 11,315,654 B2
(45) Date of Patent: Apr. 26, 2022

(54) MEMORY TESTING TECHNIQUES

(71) Applicant: Arm Limited, Cambridge (GB)

(72) Inventors: Andy Wangkun Chen, Austin, TX (US); Yannis Jallamion-Grive, Mouans Sartoux (FR); Cyrille Nicolas Dray, Antibes (FR); Frank David Frederick, Austin, TX (US)

(73) Assignee: Arm Limited, Cambridge (GB)

( * ) Notice: Subject to any disclaimer, the term of this patent is extended or adjusted under 35 U.S.C. 154(b) by 73 days.

(21) Appl. No.: 16/151,220

(22) Filed: Oct. 3, 2018

(65) Prior Publication Data

US 2020/0111537 A1    Apr. 9, 2020

(51) Int. Cl.
| G11C 29/44 | (2006.01) |
| G11C 29/42 | (2006.01) |
| G11C 29/52 | (2006.01) |
| G11C 29/14 | (2006.01) |
| G11C 29/04 | (2006.01) |
| G11C 29/00 | (2006.01) |

(52) U.S. Cl.
CPC ............. *G11C 29/44* (2013.01); *G11C 29/14* (2013.01); *G11C 29/42* (2013.01); *G11C 29/52* (2013.01); *G11C 29/81* (2013.01); *G11C 2029/0409* (2013.01)

(58) Field of Classification Search
None
See application file for complete search history.

(56) References Cited

U.S. PATENT DOCUMENTS

| 7,308,621 | B2 * | 12/2007 | Adams | G11C 29/14 |
| | | | | 714/718 |
| 8,560,927 | B1 * | 10/2013 | Pagiamtzis | G06F 11/10 |
| | | | | 714/704 |
| 9,583,216 | B2 * | 2/2017 | Jones | G11C 29/42 |
| 2010/0281302 | A1 * | 11/2010 | Earle | G06F 11/1048 |
| | | | | 714/32 |
| 2017/0125125 | A1 * | 5/2017 | Narayanan | G11C 29/38 |

* cited by examiner

*Primary Examiner* — Cynthia Britt
*Assistant Examiner* — Matthew W Wahlin
(74) *Attorney, Agent, or Firm* — Pramudji Law Group PLLC; Ari Pramudji

(57) ABSTRACT

Various implementations described herein refer to an integrated circuit having first circuitry and second circuitry. The first circuitry receives first input data and bypasses error correction circuitry to determine whether the first input data has one or more first errors. The second circuitry receives second input data and enables the error correction circuitry to determine whether the second input data has one or more second errors.

20 Claims, 8 Drawing Sheets

MEMORY TESTING TECHNIQUES

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Conventional memory built-in self testing (MBIST) may find some errors; however, other errors are not being detected or repaired with MBIST because conventional MBIST does not use error correction coding (ECC) for other error repair. As such, there exists a need to improve memory testing so as to efficiently use MBIST and ECC logic to improve the yield of random access memory (RAM).

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to various testing schemes and techniques for memory applications. For instance, various schemes and techniques described herein are directed to memory built-in self-testing (MBIST) for efficient redundancy and ECC usage to improve yield of memory cells. Some MBIST testing locates some errors without ECC and repairs some errors using redundancy. In some instances, redundancy repair may refer to column and/or row redundancy repair. If some errors remain after redundancy repair, MBIST typically determines such a tested chip as a bad memory chip. Some of these errors may be fixed using ECC logic. Using ECC logic to repair some errors is desirable to improve yield on RAM, such as eMRAM. Therefore, various schemes and techniques described herein are directed to adapting MBIST for testing and repairing using redundancy and ECC. Thus, in various implementations, multiple bits may be corrected (or repaired) using ECC correction for some errors, while still reserving one or more bits for ECC correction in other in-field errors. To overcome deficiencies of conventional MBIST techniques, the memory testing schemes and techniques described herein provide for building a memory system to interface with a MBIST controller so as to bypass ECC, enable and use ECC logic, and also detect 3-bit errors.

Various implementations of memory testing circuitry for memory applications will now be described in greater detail herein with reference to FIGS. 1-8.

Figure 1:
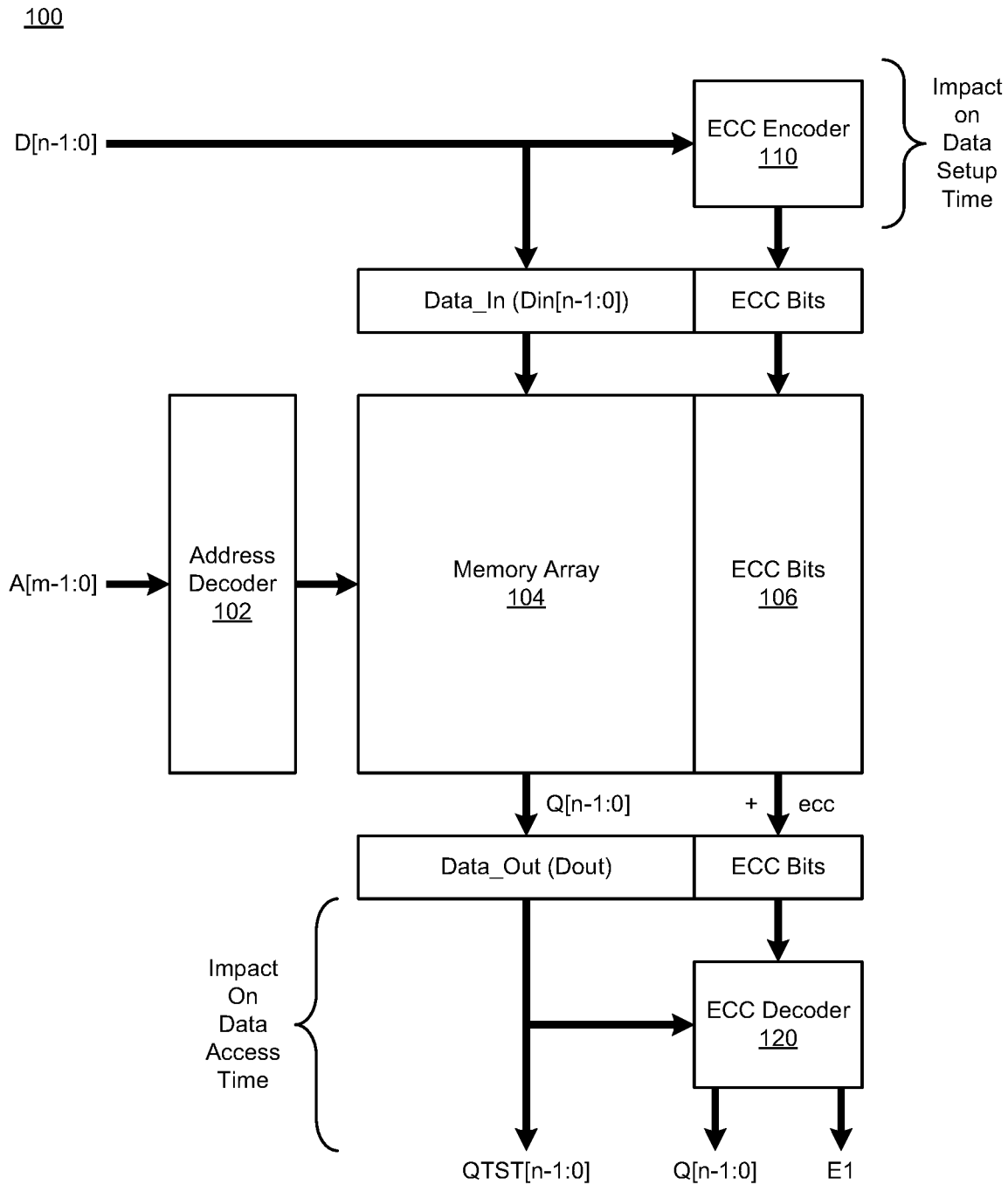
FIG. 1 illustrates a diagram of memory circuitry in accordance with various implementations described herein.

FIG. 1 illustrates a block diagram of memory circuitry 100 in accordance with various implementations described herein.

As shown in FIG. 1, the memory circuitry 100 may include various circuitry including an address decoder 102, a memory array 104, error correction coding (ECC) bits 106, an ECC encoder 110, and an ECC decoder 120. The address decoder 102 may receive an address (A[m−1:0]) for accessing bitcells in the memory array 104, which are arranged in columns and rows. The memory array 104 receives input data (D[n−1:0]), and also, the ECC encoder 110 receives the input data (D[n−1:0]) and generates ECC bits 106 associated with the input data (D[n−1:0]). The ECC encoder 110 has an impact on data setup time due to processing the input data (D[n−1:0]) and generating the ECC bits 106 for the input data (D[n−1:0]). The memory array provides output data (Dout: Q[n−1:0]) as output test data (QTST[n−1:0]. The data encoder 120 receives the output data (Q[n−1:0]) from the memory array 104 and the ECC bits 106, and the data encoder 120 decodes the output data (Q[n−1:0]) and the ECC bits 106 (E1). The ECC decoder 120 has an impact on data access time due to processing the output data (Q[n−1:0]) and decoding the ECC bits 106 (E1) associated with the output data (Q[n−1:0]). In some instances, in reference to E1, i.e., ECC bits 106, there may be some added logic outside of the memory to write back the corrected (or repaired) data to prevent (or at least inhibit) a single-bit error to become a multi-bit error later, such as, e.g., a double-bit (i.e., 2-bit) error.

In some implementations, the data input (D[n-1:0]) may be encoded with ECC check bit generation logic into the extra ECC bits 106, and functional data bits (n) and ECC bits (ecc) may be written into memory. When reading out, the full data bits (m) and the ECC bits (ecc) may be used to decode into a syndrome. The syndrome may be used for error detection and error correction. The final data output has n bits. Therefore, the functional data bus width has n bits, and the ECC has multi-bit (ecc) correction capability, such as, e.g., 2-bit and 3-bit correction capability. The full memory macro (functional+ecc) data bus width has m bits, wherein m=n+ecc. Also, the extra ECC check bits (ecc) refers to (m-n) bits, wherein ecc=m-n. Further, the MBIST 230 may be configured to mask bits [m-1:n] when the ECC check enable is enabled.

In various implementations, each bitcell in the memory array 104 may also be referred to as a memory cell, and each bitcell may be configured to store at least one data bit value (e.g., a data value associated with logical '0' or '1'). Each row of bitcells in the memory array 104 may include any number of bitcells or memory cells arranged in various configurations, such as, e.g., a two-dimensional (2D) memory array having columns and rows of multiple bitcells arranged in a 2D grid pattern with 2D indexing capabilities. Each bitcell may be implemented with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit. In other instances, each memory cell may be implemented with an embedded magneto-resistive RAM (eMRAM) cell, or some other type of non-volatile memory cell.

Generally, there are multiple types of memory structures: one-wordline devices (i.e., single port) and multi-wordline devices (i.e., multi-port memory, such as, e.g., dual port memory). One-wordline devices (e.g., ROM, RAM, DRAM, SRAM, etc.) may refer to devices having only one access port, which may be referred to as access devices. The bitlines may utilize single rail or dual rail architecture. The transistor types (e.g., N-type MOS and P-type MOS) may be referred to as access transistors. In some scenarios, high-density SRAM bitcells that are implemented with minimally sized transistors may limit Vmin of a design. However, in FinFET technology, device sizing quantization remains a challenge for compact 6T SRAM bitcells with minimum-size transistors. Thus, in some implementations, careful optimization of design memory assist circuits may be used to deliver low power memory operation. Further, each bitcell in the memory array 104 may be accessed with a wordline WL and complementary bitlines BL, NBL.

Generally, static RAM bitcells may include 6T bitcells, which may have access ports controlled by wordlines (WLs). In some other cases, static RAM bitcells may be implemented with a 5T bitcell, 4T 2R bitcell, or various other types of CMOS SRAM cells, such as, e.g., 8T, 10T or more transistors per bit. Further, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Thus, although these multi-ports transistor types may vary within each bitcell, there may also be a need to have a variation between arrays as in a left half array and a right half array.

In some implementations, other RAM bitcells may include eMRAM cells. Unlike conventional RAM cells, such as, e.g., SRAM, data in eMRAM is stored using magnetic storage elements, instead of using an electric charge or current. The magnetic elements may be formed with two ferromagnetic plates separated by a thin insulating layer, wherein one plates has a set polarity with a permanent magnet and the other plate is selectively magnetized to show a resistive differential across the plates. This configuration is known as a magnetic tunnel junction and forms the structure for an MRAM cell. To store data, when the two plates have the same magnetization alignment (low resistance state), this may be translated as a logical 1 state and when the magnetization alignment is not the same (high resistance state), this may be translated as a logical 0 state.

The memory circuitry 100 including each bitcell in the memory array 104 may be implemented as an integrated circuit (IC) with various types of memory circuitry, such as, e.g., random access memory (RAM), and/or any other types of memory, including any type of volatile memory and non-volatile memory. The memory circuitry 100 may be implemented as an IC with single and/or dual rail memory architectures. The memory circuitry 100 may also be integrated with computing circuitry and related components on a single chip. Further, the memory circuitry 100 may be implemented in an embedded system for various types of electronic, mobile, and/or biometric applications.

FIGS. 2-6 illustrate diagrams of memory testing circuitry in accordance with various implementations described herein.

Figure 2:
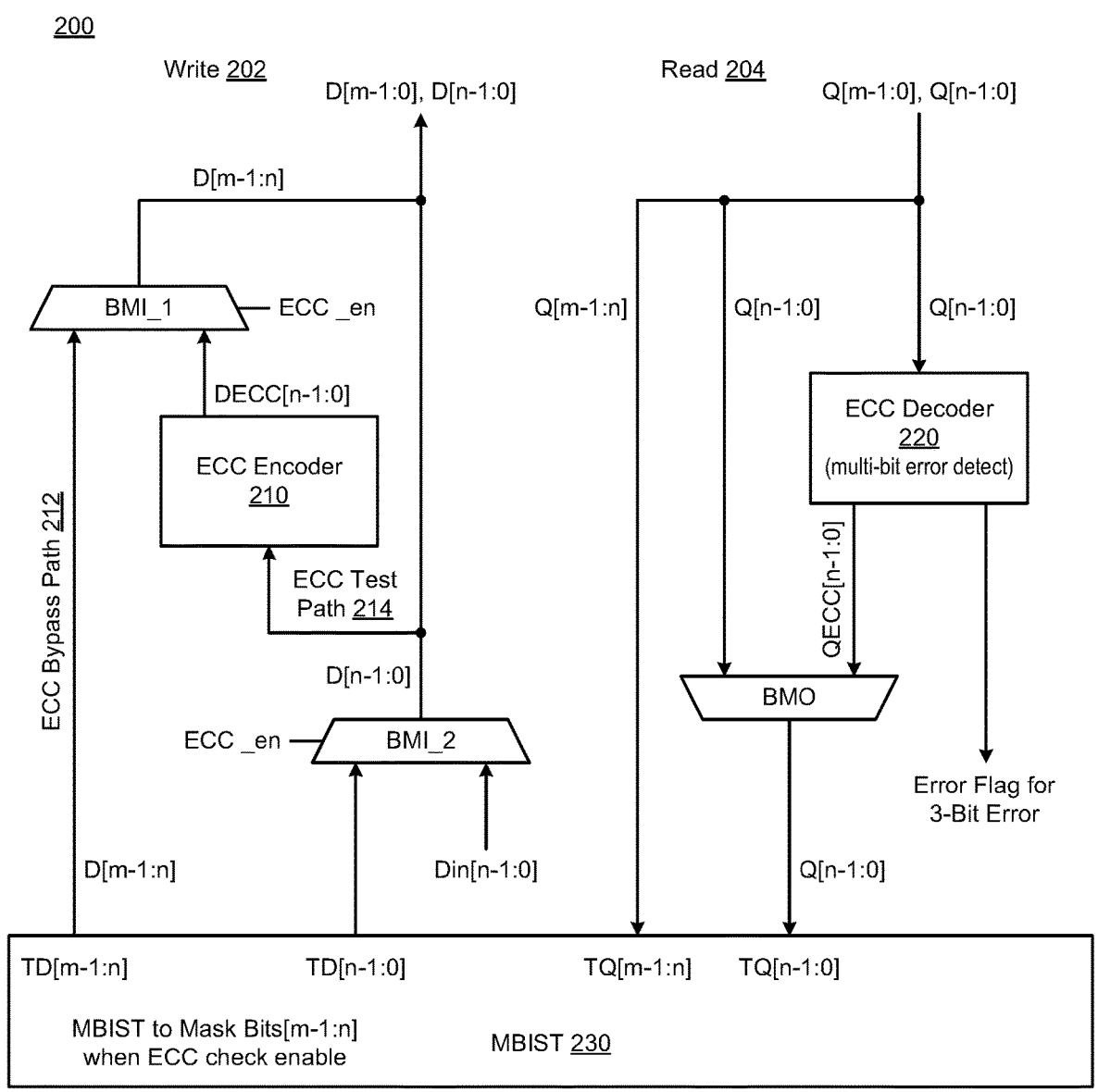
FIGS. 2-6 illustrate diagrams of memory testing circuitry in accordance with various implementations described herein.

FIG. 2 illustrates a diagram of memory testing circuitry 200 in accordance with various implementations described herein. As shown in FIG. 2, the memory testing circuitry 200 includes a memory built-in self-test (MBIST) circuitry 230 having write input path circuitry 202 and read output path circuitry 204.

In some implementations, the write input path circuitry 202 may include multiple BistMux input devices (BMI_1, BMI_2) and an ECC encoder 210. The MBIST 230 may provide first test data (TD[m−1:n]) to the first BistMux (BMI_1). The first test data (TD[m−1:n]) may refer to first data (D[m−1:n]). The first BistMux (BMI_1) may receive the first data (D[m−1:n]) via an ECC bypass path 212 and ECC encoded data (DECC[n−1:0]), and the first BistMux (BMI_1) may provide first data (D[m−1:0]) as output data based on an enable signal (ECC_en). Also, the MBIST 230 may provide second test data (TD[n−1:0]) to a second BistMux (BMI_2). The second BistMux (BMI_2) may receive the second test data (TD[n−1:0]) and input data (Din[n−1:0]), and the second BistMux (BMI_2) may provide second data (D[n−1:0]) to the ECC encoder 210 and also to the ECC test path 214 based on the enable signal (ECC_en). The ECC encoder 210 may receive the second data (D[n−1:0]) from the second BistMux (BMI_2), process the second data (D[n−1:0]), and then provide ECC encoded data (DECC[n−1:0]) to the first BistMux (BMI_1). Thus, as shown in FIG. 2, the write input path circuitry 202 may provide the first data (D[m−1:0]) via the ECC bypass path 212, and also, the write input path circuitry 202 may provide the second data (D[n−1:0]) via the ECC test path 214.

In some implementations, the functional data bus width has n bits, and the ECC has multi-bit (ecc) correction capability, such as, e.g., 2-bit and 3-bit (or more) correction capability. As described herein, the full memory macro (functional+ecc) data bus width has m bits, wherein m=n+ecc. Further, the extra ECC check bits (ecc) refers to (m−n) bits, wherein ecc=m−n. In addition, the MBIST 230 may be configured (or adapted) to mask bits [m−1:n] when the ECC check enable (ECC_en) is enabled.

In some implementations, the ECC encoder 210 may perform various functions and operations that are associated with error correction encoding. For instance, the ECC encoder 210 may generate ECC check-bits based on the input data (Din).

Therefore, as shown in FIG. 2, the memory testing circuitry 200 includes first circuitry (e.g., BMI_1, 212) that may receive first input data (e.g., TD[m−1:m], D[m−1:n]) and bypasses error correction circuitry (e.g., via 212) to determine whether the first input data (e.g., TD[m−1:n], D[m−1:n]) has one or more first errors. In some instances, the first circuitry (e.g., BMI_1, 212) may allow (or provide) for use of redundancy to repair the one or more first errors in the first input data (e.g., TD[m−1:n], Din[m−1:n]). In some instances, the first errors may refer to data-bit errors and/or random errors found in memory hardware components.

Also, as shown in FIG. 2, the memory testing circuitry 200 includes second circuitry (e.g., BMI_1, 210, BMI_2, 214) that may receive second input data (e.g., TD[n−1:0], Din[n−1:0]) and may enable error correction circuitry (e.g., 210) to determine whether second input data (e.g., TD[n−1:0], Din[n−1:0]) has one or more second errors. In some instances, the second circuitry (e.g., BMI_1, 210, BMI_2, 214) may allow for use of error correction coding (ECC) to repair the one or more second errors in the second input data (e.g., TD[n−1:0], Din[n−1:0]). In some instances, the second errors may refer to data-bit errors and/or random errors found in memory hardware components.

The memory testing circuitry 200 may include a single memory built-in self-test circuitry (e.g., MBIST 230) that is coupled to the first circuitry (e.g., BMI_1, 212) and the second circuitry (e.g., BMI_1, 210, BMI_2, 214) so as to provide the first input data (e.g., TD[m−1:n], D[m−1:0]) to the first circuitry (e.g., BMI_1, 212) and the second input data (e.g., TD[n−1:0], Din[n−1:0]) to the second circuitry (e.g., BMI_1, 210, BMI_2, 214). Also, in some implementations, the first circuitry (e.g., BMI_1, 212) may bypass use of the error correction circuitry (e.g., 210) during MBIST (memory built-in self-test) testing of the first input data (e.g., TD[m−1:n], D[m−1:n]).

The first input data (e.g., TD[m−1:n], D[m−1:0]) includes full width data having a first number of bits (m), and the second input data (TD[n−1:0], Din[n−1:0]) may include functional data having a second number of bits (n). As such, the first number of bits (m) may include the second number of bits (n) and a third number of check-bits (ecc) for error correction coding (ECC), wherein n=m+ecc.

The read output path circuitry 204 may include a BistMux output device (BMO) and an ECC decoder 220. The read output path circuitry 204 may receive first output (Q) data (Q[m−1:0]) and second output (Q) data (Q[n−1:0]). The MBIST 230 may receive the first output data (Q[m−1:0]) as first test data (TQ[m−1:n]). The ECC decoder 220 may receive the second output data (Q[n−1:0]), process/decode/detect multi-bit errors, and provide decoded data (QECC[n−1:0]) to the BistMux output device (BMO). Also, the ECC decoder 220 may generate and provide an error flag for multi-bit error detection, and in some instances, the multi-bit errors may include 3-bit errors, or more. The BistMux output device (BMO) may receive second output data (Q[n−1:0]) and the decoded data (QECC[n−1:0]), and the BistMux output device (BMO) may provide second output data (Q[n−1:0]) as second test data (TQ[n−1:0]).

In some implementations, the ECC decoder 220 may perform various functions and operations that are associated with error correction decoding. For instance, the ECC decoder 220 may generate ECC syndrome, generate ECC error position, correct ECC errors, and also generate an ECC error detection flag.

Therefore, as shown in FIG. 2, the memory testing circuitry 200 includes third circuitry (e.g., 220) that may determine whether the first input data (D[m−1:0] or Q[m−1:0]) has multi-bit errors, such as, e.g., 3-bit errors. As such, the third circuitry (e.g., 220) may generate a multi-bit error flag after detecting the multi-bit errors in the first input data (D[m−1:0] or Q[m−1:0]). In some instances, the multi-bit errors include 3-bit errors, and the third circuitry (e.g., 220) may detect 3-bit errors in the first input data (D[m−1:0] or Q[m−1:0]). In some instances, the MBIST 230 may be configured to mask bits [m−1:n] when the ECC check enable is enabled.

In some implementations, as shown in FIG. 2, at least one BistMux device may be inserted in the memory wrapper. As such, the following may apply:

ECC_check_enable=0 will bypass ECC logic and check full m bits;

ECC_check_enable=1 will use ECC logic and check n bits; and

ECC_check_enable=1 will check the error flag for 3-bit error.

Figure 3:
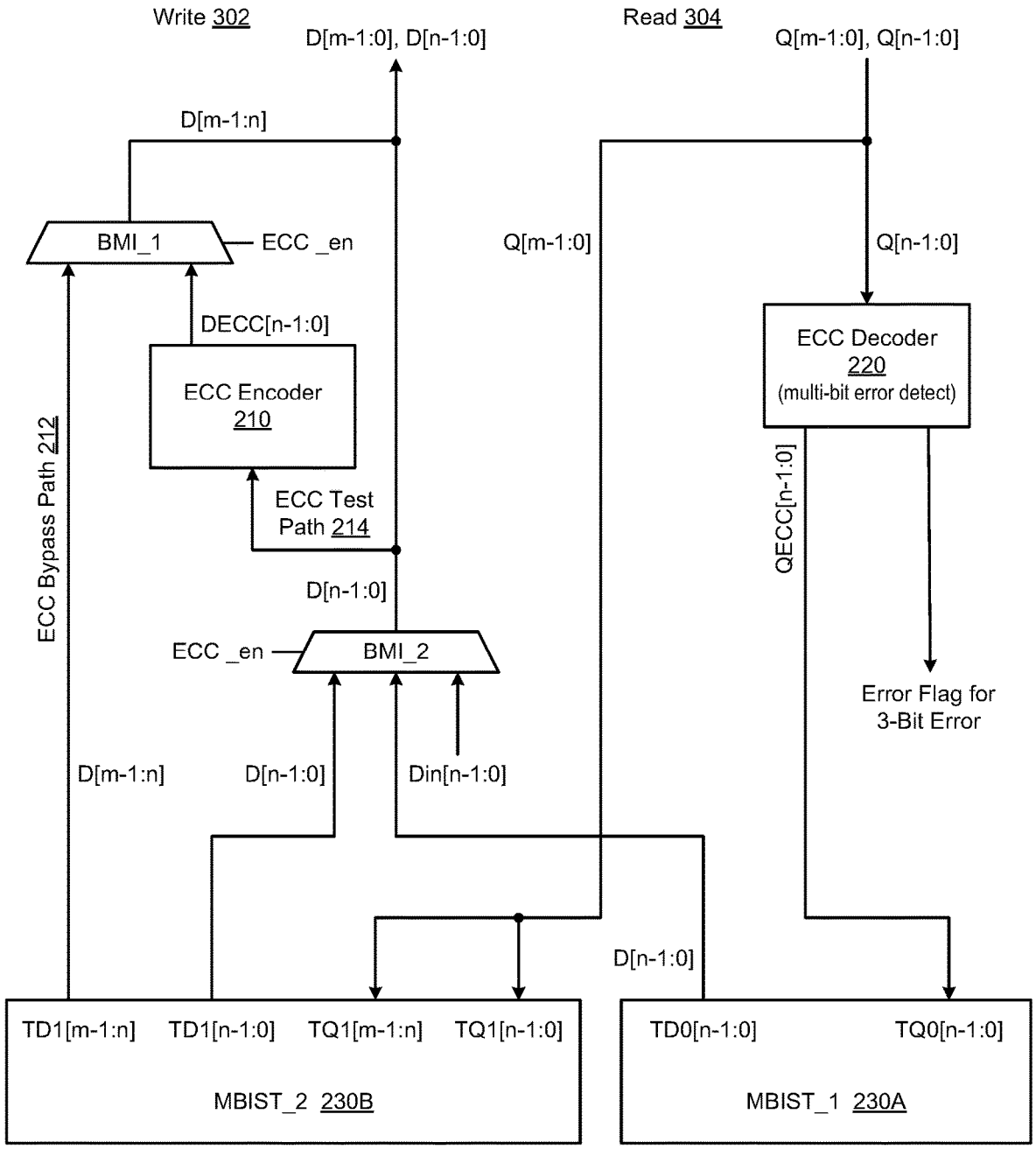

FIG. 3 illustrates a diagram of memory testing circuitry 300 in accordance with various implementations described herein.

As shown in FIG. 3, the memory testing circuitry 300 may include multiple memory built-in self-test (MBIST) circuitry 230A, 230B having write input path circuitry 302 and read output path circuitry 304. The memory testing circuitry 300 of FIG. 3 is similar to the memory testing circuitry 200 of FIG. 2, wherein similar components have similar scope, features, and related characteristics as described herein.

The multiple MBIST circuitry 230A, 230B includes first MBIST circuitry 230A and second MBIST circuitry 230B. The first MBIST circuitry 230A may provide test input data (TD0[n−1:0]) to the second BistMux (BMI_2), and the first MBIST circuitry 230A may receive decoded data (QECC[n−1:0]) from ECC decoder 220 as test output data (TQ0[n−1:0]). The second MBIST circuitry 230B may provide test input data (TD1[m−1:n]) to the first BistMux (BMI_1), and the second MBIST circuitry 230B may provide test input data (TD1[n−1:0]) to the second BistMux (BMI_2). Also, the second MBIST circuitry 230B may receive output (Q) data (Q[m−1:0]) as test output data (TQ1[m−1:n]) and test output data (TQ1[n−1:0]). Further, the second BistMux (BMI_2) may receive test input data (TD1[n−1:0]) from the second MBIST 230B, receive test input data (TD0[n−1:0]) from the first MBIST 230A, and receive the data input (Din[n−1:0]).

The write input path circuitry 302 of FIG. 3 may operate similarly to the write input path circuitry 202 of FIG. 2. For instance, second BistMux (BMI_2) may provide the second data (D[n−1:0]) to the ECC encoder 210 via the ECC test path 214 based on the enable signal (ECC_en). The ECC encoder 210 may receive the second data (D[n−1:0]) from the second BistMux (BMI_2), process the second data (D[n−1:0]), and provide ECC encoded data (DECC[n−1:0]) to the first BistMux (BMI_1). The first BistMux (BMI_1) may receive the first data (D[m−1:n]) via the ECC bypass path 212 and the ECC encoded data (DECC[n−1:0]), and the first BistMux (BMI_1) may provide the first data (D[m−1:0]) based on the enable signal (ECC_en). Also, the write input path circuitry 202 may provide first data (D[m−1:0]) via the ECC bypass path 212, and the write input path circuitry 202 may provide the second data (D[n−1:0]) via the ECC test path 214.

The read output path circuitry 304 of FIG. 3 may operate similarly to the read output path circuitry 204 of FIG. 2. For instance, the read output path circuitry 304 may receive second output (Q) data (Q[n−1:0]) and first output (Q) data (Q[m−1:0]). The MBIST 230A may receive the first output data (Q[m−1:0]) as test data (TQ1[m−1:n]) and as test data (TQ1[n−1:0]). The ECC decoder 220 may receive the second output data (Q[n−1:0]), process/decode/detect multi-bit errors, and provide decoded data (QECC[n−1:0]) to the MBIST 230A as test output data (TQ0[n−1:0]). Also, the ECC decoder 220 may generate and provide an error flag for multi-bit error detection, and in some instances, the multi-bit errors may include 3-bit errors, or more.

In some implementations, as shown in FIG. 3, multiple BistMux devices may be inserted in the memory wrapper. As such, the following may apply:

ECC_check_enable=0 will bypass ECC logic and check full m bits;

ECC_check_enable=1 will use ECC logic and check n bits; and

ECC_check_enable=1 will use error flag to corrupt the TQ output intentionally.

Figure 4:
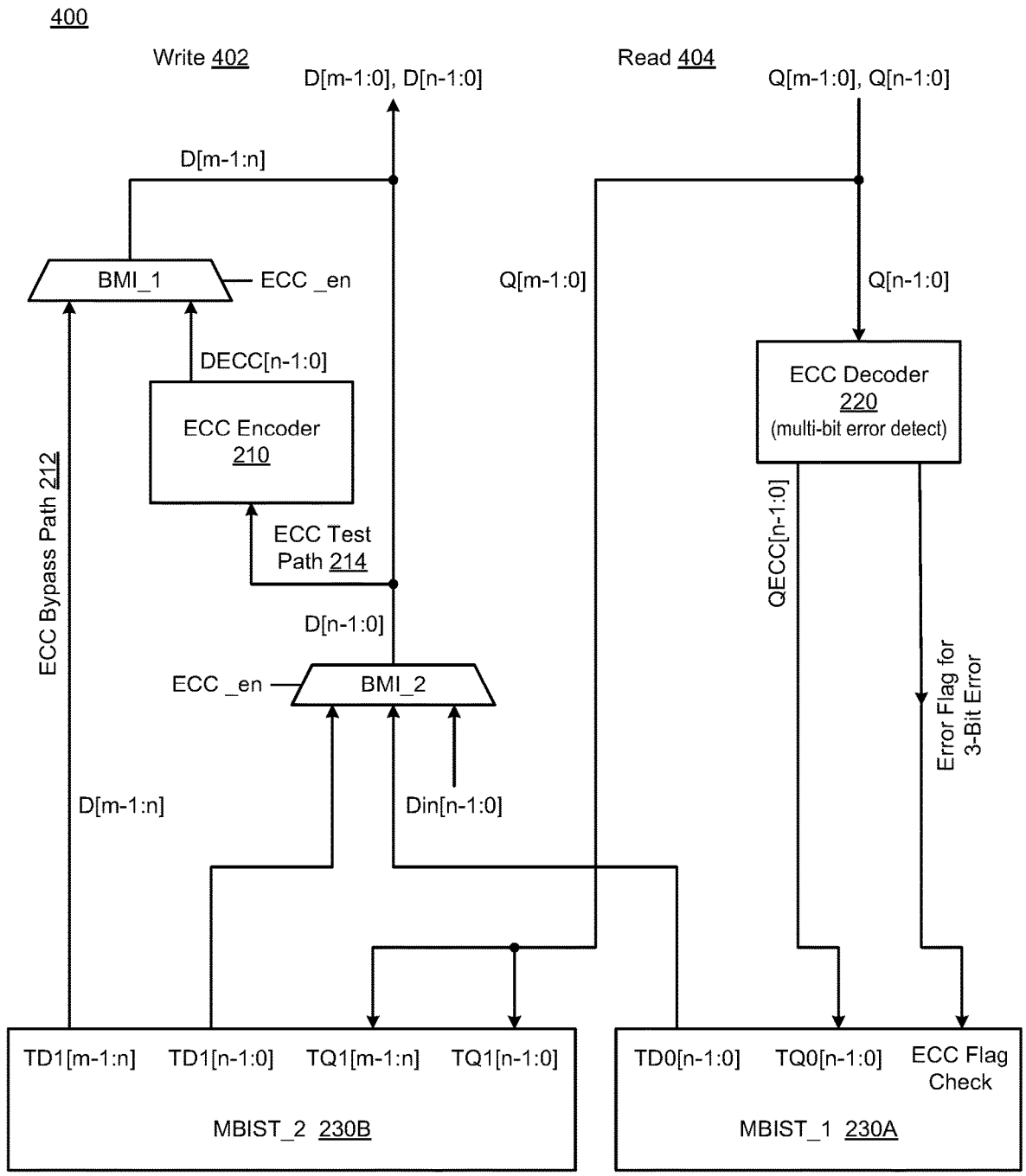

FIG. 4 illustrates a diagram of memory testing circuitry 400 in accordance with various implementations described herein.

As shown in FIG. 4, the memory testing circuitry 400 may include multiple memory built-in self-test (MBIST) circuitry 230A, 230B having write input path circuitry 402 and read output path circuitry 404. The memory testing circuitry 400 of FIG. 4 is similar to the memory testing circuitry 300 of FIG. 3, wherein similar components have similar scope, features, and related characteristics as described herein.

The write input path circuitry 402 of FIG. 4 may operate substantially similar to the write input path circuitry 302 of FIG. 3. Also, the read output path circuitry 404 of FIG. 4 may operate substantially similar to the read output path circuitry 304 of FIG. 3, except for the error flag for multi-bit errors is provided to the MBIST 230A. For instance, ECC decoder 220 may receive the second output data (Q[n−1:0]), process/decode/detect multi-bit errors, and provide the decoded data (QECC[n−1:0]) to the MBIST 230A as test output data (TQ0[n−1:0]). Also, the ECC decoder 220 may generate and provide an error flag for multi-bit error detection to the MBIST 230A as an ECC flag check input, and in some instances, the multi-bit errors may include 2-bit errors, 3-bit errors, or more.

In some implementations, as shown in FIG. 4, multiple BistMux devices may be inserted in the memory wrapper. As such, the following may apply:

Two MBIST controllers may be used: MBIST_1 for m bits, and MBIST0 for n bits;

ECC_check_enable=0 will bypass ECC logic and check full m bits by using MBIST_1;

ECC_check_enable=1 will use ECC logic and check n bits by using MBIST0; and

ECC_check_enable=1 will check the error flag for 3 bit error by using MBIST0.

Figure 5:
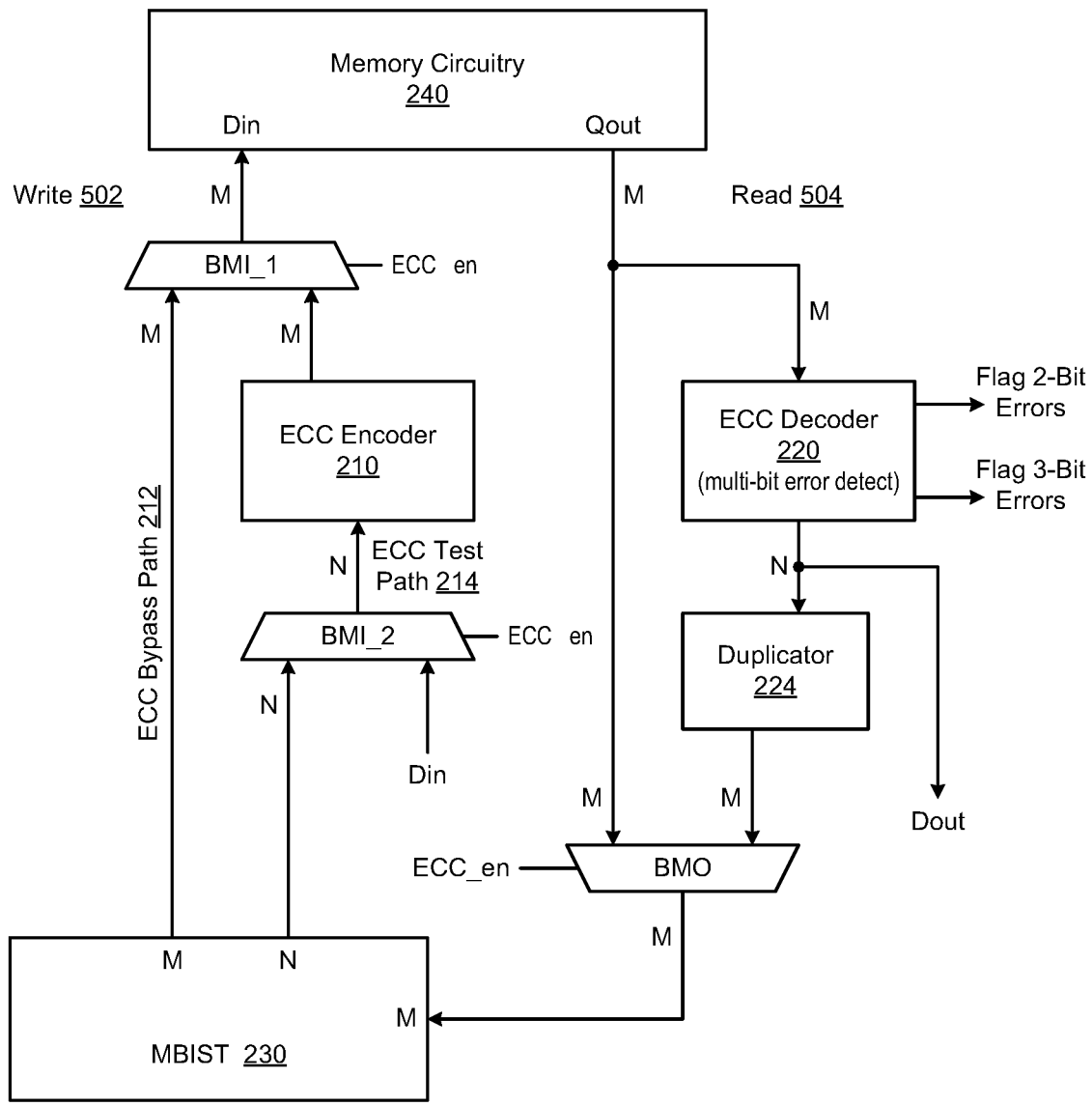

FIG. 5 illustrates a diagram of memory testing circuitry 500 in accordance with various implementations described herein.

As shown in FIG. 5, the memory testing circuitry 500 may include the single memory built-in self-test (MBIST) circuitry 230 having write input path circuitry 502 and read output path circuitry 504. The memory testing circuitry 500 of FIG. 5 is similar to the memory testing circuitry 200 of FIG. 2, wherein similar components have similar scope, features, and related characteristics as described herein.

The write input path circuitry 502 of FIG. 5 may operate in a substantially similar manner to the write input path circuitry 202 of FIG. 2. For instance, the MBIST 230 may provide first data (M) to first BistMux (BMI_1) via the ECC bypass path 212. The first BistMux (BMI_1) may receive the first data (M via ECC bypass path 212) and the ECC encoded data (M from the encoder 210), and the first BistMux (BMI_1) may provide the first data (M) to a data input (Din) of memory circuitry 240 based on the enable signal (ECC_en). The MBIST 230 may provide second data (N) to second BistMux (BMI_2). The second BistMux (BMI_2) may receive the second data (N) and input data (Din), and the second BistMux (BMI_2) may provide second data (N) to the ECC encoder 210 via the ECC test path 214 based on the enable signal (ECC_en). The ECC encoder 210 may receive the second data (N) from second BistMux (BMI_2), process the second data (N), and provide ECC encoded data (M from the encoder 210) to the first BistMux (BMI_1).

The read output path circuitry 504 of FIG. 5 may operate in a substantially similar manner to the read output path circuitry 204 of FIG. 2. For instance, the read output path 504 may include the BistMux output device (BMO) and the ECC decoder 220. The read output path 504 may receive first output data (M) from a data output (Qout) of memory circuitry 240. The ECC decoder 220 may receive the first output data (M), process/decode/detect multi-bit errors, and provide decoded data (N) as data output (Dout) to the BistMux output device (BMO) via a data duplicator 224. Also, the ECC decoder 220 may generate and provide an error flag for multi-bit error detection, and in some instances, the multi-bit errors include 2-bit errors, 3-bit errors, or more. The BistMux output device (BMO) may receive first output data (M) from the data output (Qout) of the memory circuitry 240 and receive duplicated data (M) from the data duplicator 224, and the BistMux output device (BMO) may provide output data (M) to the MBIST 230.

In some implementations, as shown in FIG. 5, at least one BistMux device may be inserted in the memory wrapper. As such, the following may apply:

ECC_check_enable=0 will bypass ECC logic and check full m bits;

ECC_check_enable=1 will use ECC logic and check n bits;

ECC_check_enable=1 will check the error flag for 3 bit error; and

ECC_check_enable=1, duplicate MSB 2-bits from n bits to m bits, e.g., 0000 0000 0000=>000000 0000 0000
1111 1111 1111=>111111 1111 1111
0101 0101 0101=>010101 0101 0101
1010 1010 1010=>101010 1010 1010

Figure 6:
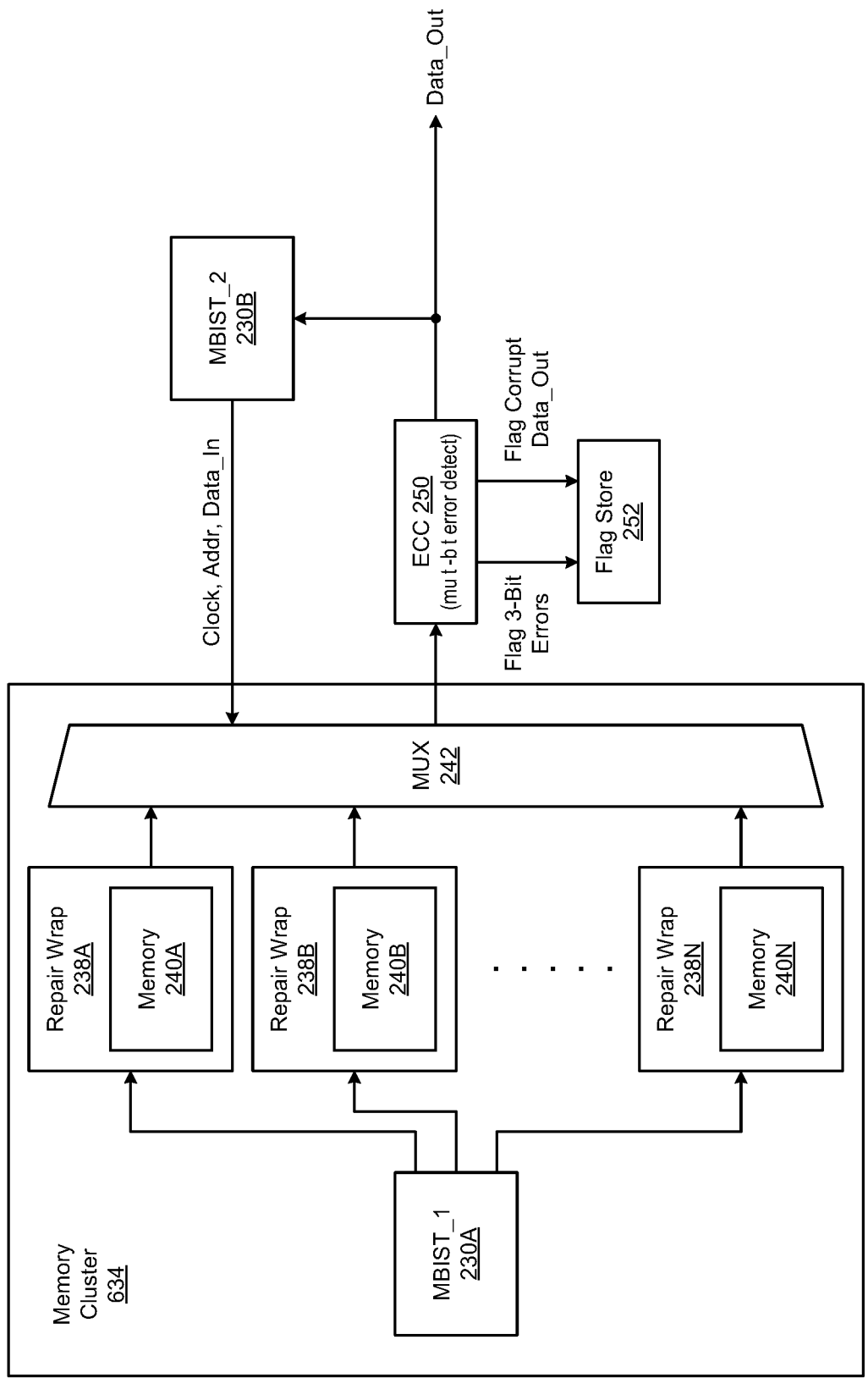

FIG. 6 illustrates a diagram of memory testing circuitry 600 in accordance with various implementations described herein.

As shown in FIG. 6, the memory testing circuitry 600 may include a memory cluster 634, a multiplexer (MUX) 242, and the multiple memory built-in self-test (MBIST) circuitry 230A, 230B. The memory testing circuitry 600 of FIG. 6 is similar to the memory testing circuitry 200, 300 of FIGS. 2-3, wherein similar components (e.g., MBIST 230A, 230B) ay have similar scope, features, and related characteristics as described herein.

The memory cluster 634 may include the MBIST 230A, the MUX 242, and multiple repair wraps 238A, 238B, . . . , 238N with each having memory circuitry 240A, 240B, . . . , 240N, respectively. The MBIST 230A provides data signals to each repair wrap 238A, 238B, . . . , 238N, and each repair wrap 238A, 238B, . . . , 238N provides data signals to the MUX 242. The MUX 242 provides a data signal to ECC circuitry 250, and the ECC circuitry 250 may process/decode/detect multi-bit errors (e.g., 3-bit errors) and provide output data (Data_Out). The ECC circuitry 250 may flag multi-bit errors (e.g., 3-bit errors) and flag corrupt output data (Data_Out) for storage in flag store 252. The MBIST 230B may receive the output data (Data_Out) from the ECC circuitry 250 and provide multiple signals to the MUX 242, such as, e.g., clock, address (Addr), and input data (Data_In).

In some implementations, as shown in FIG. 6, multiple BistMux devices may be inserted in the memory wrapper. As such, the following may apply:

Two MBIST controllers may be used: MBIST_1 for m bits, and MBIST_2 for n bits;

ECC_check_enable=0 will bypass ECC logic and check full m bits by using MBIST_1, and MBIST_1 will test multiple memory in parallel to reduce run time;

ECC_check_enable=1 will use ECC logic and check n bits by using MBIST_2; and

ECC_check_enable=1 will check the error flag for 3 bit error by using MBIST_2.

Figure 7:
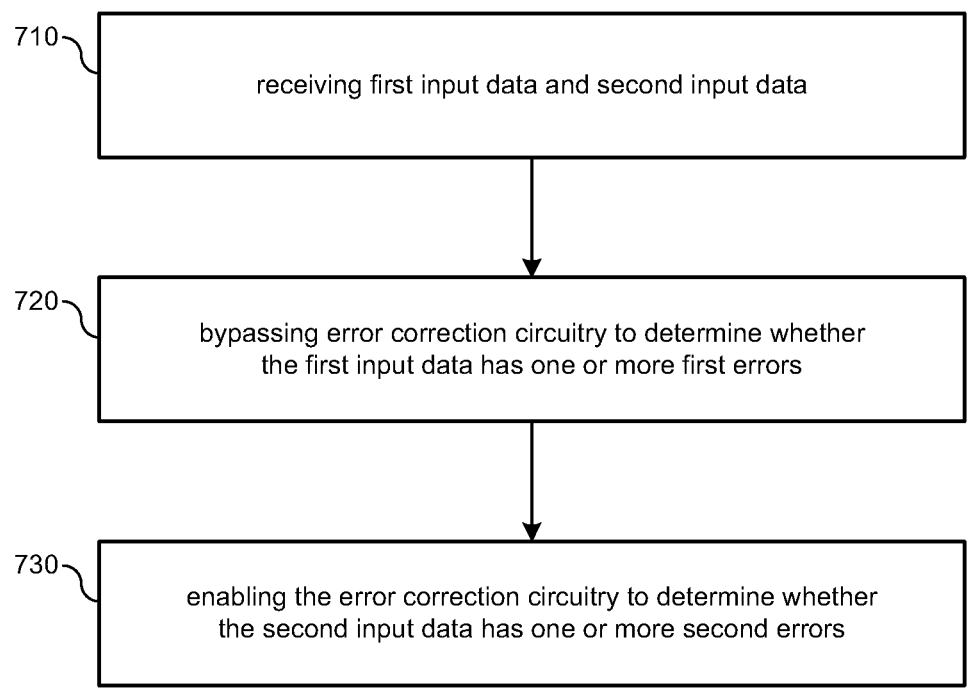
FIGS. 7-8 illustrate diagrams of methods for testing memory in accordance with various implementations described herein.
Figure 8:
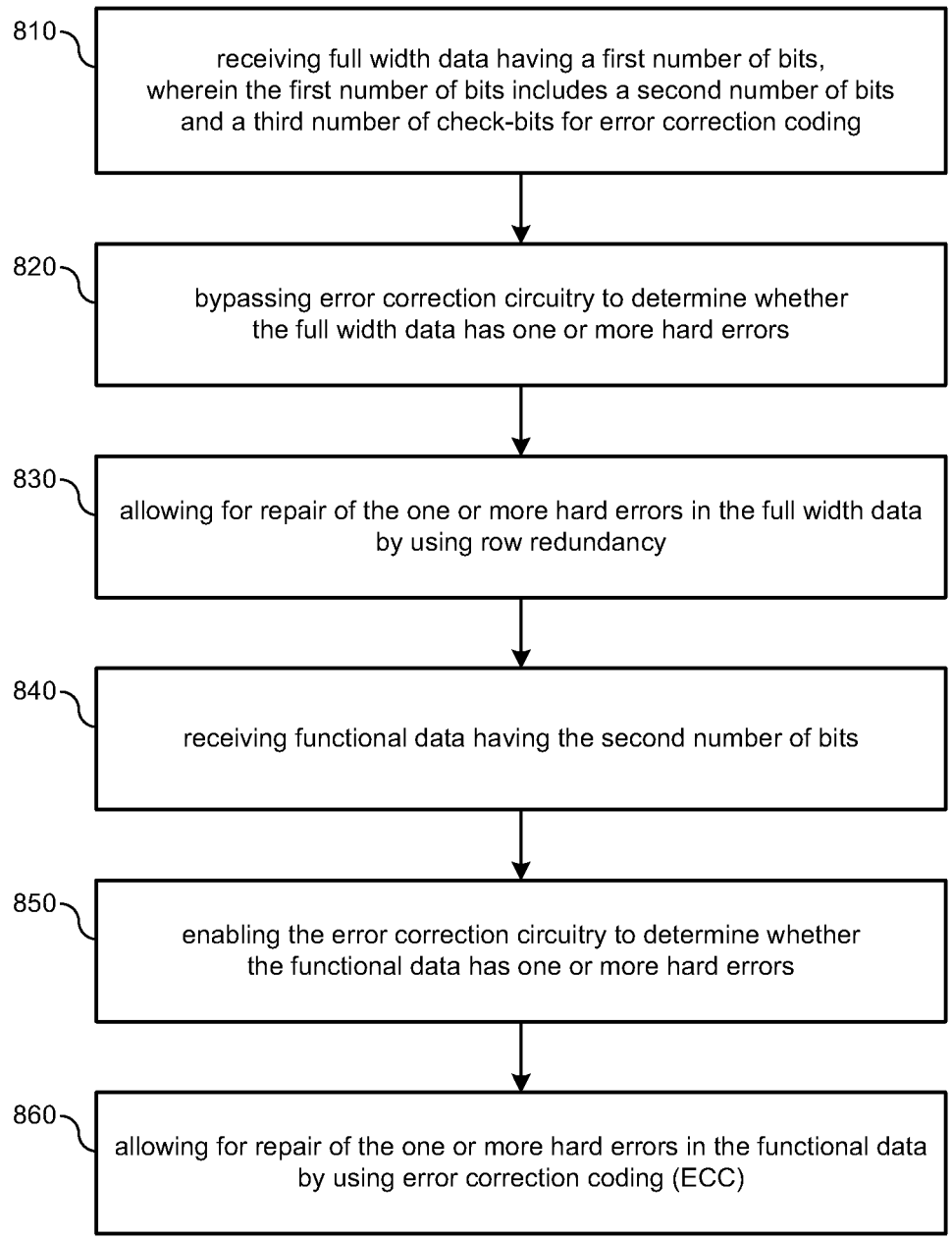

FIGS. 7-8 illustrate diagrams of methods for testing memory in accordance with various implementations described herein.

FIG. 7 illustrates a process flow diagram of a method 700 for testing memory in accordance with various implementations described herein.

It should be understood that even though method 700 may indicate a particular order of operation execution, in some cases, various certain portions of the operations may be executed in a different order, and on different systems. In other cases, additional operations and/or steps may be added to and/or omitted from method 700. Method 700 may be implemented in hardware and/or software. If implemented in hardware, method 700 may be implemented with various circuit components, such as described herein in reference to FIGS. 1-6. If implemented in software, method 700 may be implemented as a program or software instruction process that may be configured for memory testing as described herein. Further, if implemented in software, various instructions related to implementing method 700 may be stored in memory and/or a database. For instance, a computer or various other types of computing devices having a processor and memory may be configured to perform method 700.

As described and shown in reference to FIG. 7, method 700 may be utilized for testing memory in accordance with various schemes and techniques described herein above. For instance, as described herein, method 700 may be utilized for improving memory testing for efficient ECC usage to thereby improve yield.

At block 710, method 700 may receive data, such as, e.g., first input data and second input data. The first input data may include full width data having a first number of bits (m bits), and the second input data may include functional data having a second number of bits (n bits). In some implementations, the first number of bits (m bits) may include the second number of bits (n bits) and a third number of check-bits (ecc bits) for error correction coding (ECC), wherein m=n+ecc. Also, the extra ECC check-bits (ecc) may be (m−n) bits, wherein ecc=m−n.

At block 720, method 700 may bypass error correction circuitry to determine whether the first input data has one or more first errors. In some instances, bypassing the error correction circuitry may occur during MBIST (memory built-in self-test) testing of the first input data. For instance, MBIST may run m bits without ECC logic. If finding any error, method 700 may allow for use of redundancy repair. In some instances, after redundancy repair, if there are still errors, method 700 may proceed to a next block 730 to perform one or more additional operations.

In some implementations, method 700 may further include repairing the one or more first errors in the first input data using redundancy. Generally, the one or more first errors may refer to data-bit errors and/or random errors found in memory hardware components.

At block 730, method 700 may enable the error correction circuitry to determine whether the second input data has one or more second errors. In some instances, MBIST may run n bits with ECC logic. If there is more than 3-bit errors, then read output may not be corrected by ECC, and this error result may be considered as detecting a bad memory chip. If there are 3-bit errors, then read output may be corrected, but this error result may still be considered as detecting a bad memory chip, because there may be no capability of repairing in-field errors. Also, if there are 2 or less bit errors, then read output may be corrected, and this error result may be considered as detecting a good memory chip.

In some implementations, method 700 may further include repairing the one or more second errors in the second input data using error correction coding (ECC). Generally, the one or more second errors may refer to data-bit errors and/or random errors found in memory hardware components. In some implementations, method 700 may further include determining whether the second input data has multi-bit errors, and method 700 may further include generating a multi-bit error flag after detecting the multi-bit errors in the second input data. The multi-bit errors may include 3-bit errors, and determining whether the second input data has multi-bit errors includes determining whether the second input data has 3-bit errors.

In some implementations, an alternative test flow may be as follows. MBIST may be run for n bits with ECC logic, and 2 or less bit errors may be corrected with ECC and still leave 1 bit error correction capability in field. If there are 3 or more bit errors, then additional operations may be run as follows. MBIST may be run for m bits without ECC logic, and if any error is found, redundancy repair may be used. After redundancy repair, some multi-bit errors may not be fully repaired using redundancy. Thus, additional operations may be run as follows. MBIST may be run on n bits with ECC logic, and 2 or less bit errors may be corrected with ECC and still leave 1 bit error correction capability in field. If there are 3 or more bit errors, then this error result may be considered as determining a bad memory chip.

FIG. 8 illustrates a process flow diagram of a method 800 for testing memory in accordance with various implementations described herein.

It should be understood that even though method 800 may indicate a particular order of operation execution, in some cases, various certain portions of the operations may be executed in a different order, and on different systems. In other cases, additional operations and/or steps may be added to and/or omitted from method 800. Method 800 may be implemented in hardware and/or software. If implemented in hardware, method 800 may be implemented with various circuit components, such as described herein in reference to FIGS. 1-6. If implemented in software, method 800 may be implemented as a program or software instruction process that may be configured for memory testing as described herein. Further, if implemented in software, various instructions related to implementing method 800 may be stored in memory and/or a database. For instance, a computer or various other types of computing devices having a processor and memory may be configured to perform method 800.

As described and shown in reference to FIG. 8, method 800 may be utilized for testing memory in accordance with various schemes and techniques described herein above. For instance, as described herein, method 800 may be utilized for improving memory testing for efficient ECC usage to thereby improve yield.

At block 810, method 800 may receive full width data having a first number of bits (e.g., m bits), wherein the first number of bits (e.g., m bits) includes a second number of bits (e.g., n bits) and a third number of check-bits (e.g., ecc bits) for error correction coding (ECC). The full width data has m bits, wherein m=n+ecc. At block 820, method 800 may bypass error correction circuitry to determine whether the full width data has one or more first errors. At block 830, method 800 may allow for repair of the one or more first errors in the full width data by using redundancy. At block 840, method 800 may receive functional data having the second number of bits. The functional data width has n bits. At block 850, method 800 may enable the error correction circuitry to determine whether the functional data has one or more second errors. At block 860, method 800 may allow for repair of the one or more second errors in the functional data by using error correction coding (ECC). In some instances, the ECC has multi-bit correction capability, such as, e.g., 3-bit correction capability.

In some implementations, the full width data may refer to a full memory macro (functional+ecc) data bus width having m bits, and the functional data may refer to a functional data bus width having n bits, wherein m=n+ecc. Also, the extra ECC check-bits (ecc) may be (m−n) bits, wherein ecc=m−n.

In some implementations, method 800 may include determining whether the full width data has multi-bit errors, and method 800 may include generating a multi-bit error flag after detecting the multi-bit errors in the full width data. In some instances, the multi-bit errors may include 3-bit errors, and determining whether the full width data has multi-bit errors includes determining whether the full width data has 3-bit errors.

Described herein are various implementations of an integrated circuit. The integrated circuit may include first circuitry that receives first input data and bypasses error correction circuitry to determine whether the first input data has one or more first errors. The integrated circuit may include second circuitry that receives second input data and enables the error correction circuitry to determine whether the second input data has one or more second errors.

Described herein are various implementations of a method. The method may include receiving first input data and second input data. The method may include bypassing error correction circuitry to determine whether the first input data has one or more first errors. The method may include enabling the error correction circuitry to determine whether the second input data has one or more second errors.

Described herein are various implementations of a method. The method may include receiving full width data having a first number of bits, wherein the first number of bits includes a second number of bits and a third number of check-bits for error correction coding (ECC). The method may include bypassing error correction circuitry to determine whether the full width data has one or more first errors. The method may include allowing for repair of the one or more first errors in the full width data by using redundancy. The method may include receiving functional data having the second number of bits. The method may include enabling the error correction circuitry to determine whether the functional data has one or more second errors. The method may include allowing for repair of the one or more second errors in the functional data by using error correction coding (ECC).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   first circuitry that receives first input data and bypasses first error correction circuitry to determine whether the first input data has one or more first errors, wherein the first circuitry comprises a first multiplexer and is part of a write input path;
   second circuitry that receives second input data and enables the first error correction circuitry to determine whether the second input data has one or more second errors, wherein the second circuitry comprises a second multiplexer and is part of the write input path; and
   third circuitry that is part of a read output path, wherein the third circuitry comprises second error correction circuitry.

2. The integrated circuit of claim 1, wherein the first input data comprises full width data having a first number of bits, wherein the second input data comprises functional data having a second number of bits, and wherein the first number of bits includes the second number of bits and a third number of check-bits for error correction coding (ECC).

3. The integrated circuit of claim 1, wherein the third circuitry determines whether the second input data has multi-bit errors.

4. The integrated circuit of claim 3, wherein the third circuitry generates a multi-bit error flag after detecting the multi-bit errors in the second input data.

5. The integrated circuit of claim 3, wherein the multi-bit errors include 3-bit errors, and wherein the third circuitry detects 3-bit errors in the second input data.

6. The integrated circuit of claim 1, further comprising single memory built-in self-test (MBIST) circuitry coupled to the first circuitry and the second circuitry so as to provide the first input data to the first circuitry and the second input data to the second circuitry.

7. The integrated circuit of claim 1, further comprising multiple memory built-in self-test (MBIST) circuitry coupled to the first circuitry and the second circuitry so as to provide the first input data to the first circuitry and the second input data to the second circuitry.

8. The integrated circuit of claim 1, wherein the first circuitry bypasses use of the first error correction circuitry during MBIST (memory built-in self-test) testing of the first input data.

9. The integrated circuit of claim 1, wherein the first circuitry allows for redundancy to repair the one or more first errors in the first input data.

10. The integrated circuit of claim 1, wherein the second circuitry allows for error correction coding (ECC) to repair the one or more second errors in the second input data.

11. A method, comprising:
receiving first input data and second input data;
bypassing first error correction circuitry using at least a first multiplexer that is part of write input path circuitry to determine whether the first input data has one or more first errors;
enabling the first error correction circuitry using at least a second multiplexer that is part of the write input path circuitry to determine whether the second input data has one or more second errors; and
determining whether the second input data has multi-bit errors via read output path circuitry, wherein the read output path circuitry includes second error correction circuitry.

12. The method of claim 11, wherein the first input data comprises full width data having a first number of bits, wherein the second input data comprises functional data having a second number of bits, and wherein the first number of bits includes the second number of bits and a third number of check-bits for error correction coding (ECC).

13. The method of claim 11, further comprising:
generating via the read output path circuitry a multi-bit error flag after detecting the multi-bit errors in the second input data.

14. The method of claim 13, wherein the multi-bit errors include 3-bit errors, and wherein determining whether the second input data has multi-bit errors includes determining whether the second input data has 3-bit errors.

15. The method of claim 11, wherein bypassing the first error correction circuitry occurs during MBIST (memory built-in self-test) testing of the first input data.

16. The method of claim 11, further comprising allowing for repair of the one or more first errors in the first input data by using redundancy.

17. The method of claim 11, further comprising allowing for repair of the one or more second errors in the second input data by using error correction coding (ECC).

18. A method, comprising:
receiving full width data having a first number of bits, wherein the first number of bits includes a second number of bits and a third number of check-bits for error correction coding (ECC);
bypassing first error correction circuitry using at least a first multiplexer that is part of write input path circuitry to determine whether the full width data has one or more first errors;
allowing for repair of the one or more first errors in the full width data by using redundancy;
receiving functional data having the second number of bits;
enabling the first error correction circuitry using at least a second multiplexer that is part of the write input path circuitry to determine whether the functional data has one or more second errors;
allowing for repair of the one or more second errors in the functional data by using error correction coding (ECC); and
determining whether the full width data has multi-bit errors via read output path circuitry, wherein the read output path circuitry includes second error correction circuitry.

19. The method of claim 18, further comprising:
generating via the read output path circuitry a multi-bit error flag after detecting the multi-bit errors in the full width data.

20. The method of claim 19, wherein the multi-bit errors include 3-bit errors, and wherein determining whether the full width data has multi-bit errors includes determining whether the full width data has 3-bit errors.

* * * * *